US008399967B2

(12) United States Patent
Chien (10) Patent No.: US 8,399,967 B2
(45) Date of Patent: Mar. 19, 2013

(54) PACKAGE STRUCTURE

(75) Inventor: Chih-Cheng Chien, Kaohsiung (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 442 days.

(21) Appl. No.: 12/689,487

(22) Filed: Jan. 19, 2010

(65) Prior Publication Data

US 2011/0001229 A1 Jan. 6, 2011

(30) Foreign Application Priority Data

Jul. 1, 2009 (TW) .............................. 98122247 A (51) Int. Cl.
*H01L 23/495* (2006.01)
*H01L 23/10* (2006.01)
*H01L 23/34* (2006.01)
*H01L 23/29* (2006.01)
*H01L 23/28* (2006.01)

(52) U.S. Cl. ........ 257/675; 257/706; 257/787; 257/796; 257/E25.01; 257/E23.06

(58) Field of Classification Search .................. 257/675, 257/678, 692, 701, 730, 787, 796, E25.01, 257/E23.003, E23.004, E23.06, E23.123, 257/E23.125, 706

See application file for complete search history.

(56) References Cited

U.S. PATENT DOCUMENTS

| 5,648,679 | A | * | 7/1997 | Chillara et al. | 257/666 |
| 5,818,105 | A | * | 10/1998 | Kouda | 257/696 |
| 6,313,598 | B1 | * | 11/2001 | Tamba et al. | 318/722 |
| 7,034,385 | B2 | * | 4/2006 | Ambrus | 257/678 |
| 7,245,007 | B1 | * | 7/2007 | Foster | 257/678 |
| 2007/0254409 | A1 | * | 11/2007 | Yip et al. | 438/126 |
| 2009/0102031 | A1 | * | 4/2009 | Almagro et al. | 257/676 |
| 2009/0236709 | A1 | * | 9/2009 | Chen et al. | 257/676 |

* cited by examiner

*Primary Examiner* — Teresa M Arroyo
(74) *Attorney, Agent, or Firm* — J.C. Patents (57) ABSTRACT

A package structure including a circuit substrate, at least a chip, leads and an encapsulant is provided. The circuit substrate has a first surface, a second surface opposite to the first surface, and contacts disposed on the first surface. The chip is disposed on the second surface of the circuit substrate and electrically connected to the circuit substrate. The leads are disposed on the periphery of the second surface and surround the chip. Each lead has an inner lead portion and an outer lead portion and is electrically connected to the circuit substrate via the inner lead portion. The encapsulant encapsulates the circuit substrate, the chip and the inner lead portion and exposes the first surface of the circuit substrate and the outer lead portion, wherein the upper surface of the encapsulant and the first surface of the circuit substrate are coplanar with each other.

15 Claims, 6 Drawing Sheets

PACKAGE STRUCTURE

CROSS-REFERENCE TO RELATED APPLICATION

This application claims the priority benefit of Taiwan application serial no. 98122247, filed on Jul. 1, 2009. The entirety of the above-mentioned patent application is hereby incorporated by reference herein and made a part of this specification.

BACKGROUND OF THE INVENTION

1. Field of the Invention

The present invention generally relates to a package structure and a package process, and more particularly, to a package structure and a package process having good process compatibility and good system-integrating capability.

2. Description of Related Art

It is always one of the major goals for long in the electronic manufacturing industry to minimize the volumes of IC component products. A compact product with a small volume means a lower production cost, shorter signal transmission paths and better product performances.

One of key factors affecting the volume of an IC component rests in the improvement of the packaging technology. Among the contemporary technologies, the way using a leadframe to serve as a chip carrier is a quite popular and wide applicable technique, wherein a common structure is quad flat package (QFP) structure.

Along with the promotion of process capability, the architecture of integrating multi chips into a system has played a major development role in the contemporary packaging technology. However, the increasing integrity extent of chip circuits demands more contact counts for import or output required by each chip. As a result, the conventional QFP structure where a leadframe is used as a chip carrier provides a limited lead quantity and layout thereof, and thereby can not meet the modern requirements. The limited lead quantity and layout thereof is also resulted in indirectly limiting the compatibility and the system-integrating capability of a QFP structure.

SUMMARY OF THE INVENTION

Accordingly, the present invention is directed to a package structure which adopts a carrier integrating a leadframe and a circuit substrate so as to provide good compatibility and good system-integrating capability.

The present invention is also directed to a package structure having good heat dissipation capability.

The present invention is also directed to a package structure able to effectively prevent melt-flashing phenomenon during forming an encapsulant and maintain good production yield.

The present invention is further directed to a package process for fabricating the above-mentioned package structure.

The present invention provides a package structure, which includes a circuit substrate, at least a chip, a plurality of leads and an encapsulant. The circuit substrate has a first surface and a second surface opposite to the first surface, wherein the circuit substrate has a plurality of contacts disposed on the first surface. The chip is disposed on the second surface of the circuit substrate and electrically connected to the circuit substrate. The said leads are disposed on the periphery of the second surface of the circuit substrate so as to surround the chip. Each of the leads has an inner lead portion and an outer lead portion, and each lead is electrically connected to the circuit substrate via the inner lead portion thereof. The encapsulant encapsulates the circuit substrate, the chip and the inner lead portion of each lead and exposes the first surface of the circuit substrate and the outer lead portion of each lead, wherein the upper surface of the encapsulant and the first surface of the circuit substrate are coplanar with each other.

In an embodiment of the present invention, the inner lead portion has a first carrying portion and a second carrying portion. The first carrying portion of the inner lead portion is disposed on the periphery of the second surface of the circuit substrate, and the second carrying portion is connected between the first carrying portion and the outer lead portion.

In an embodiment of the present invention, the above-mentioned first carrying portion of the inner lead portion has a height difference from the second carrying portion.

In an embodiment of the present invention, the package structure further includes a heatsink embedded inside the encapsulant and contacting the inner lead portions of the leads.

In an embodiment of the present invention, the above-mentioned heatsink has a frame shape and surrounds the circuit substrate.

In an embodiment of the present invention, the package structure includes at least a first bonding wire and at least a second bonding wire, wherein each first bonding wire is electrically connected to the corresponding inner lead portion and the circuit substrate, and each second bonding wire is electrically connected between the chip and the circuit substrate.

In an embodiment of the present invention, the material of the first bonding wire and the second bonding wire includes gold, silver, copper, aluminium or an alloy thereof.

In an embodiment of the present invention, the above-mentioned package structure includes at least a third bonding wire electrically connected between the chip and the inner lead portion.

In an embodiment of the present invention, the material of the third bonding wire includes gold, silver, copper, aluminium or an alloy thereof.

In an embodiment of the present invention, the package structure further includes a cushion block, disposed at the periphery of the second surface of the circuit substrate and clamped between the inner lead portion of every lead and the second surface of the circuit substrate.

In an embodiment of the present invention, the material of the above-mentioned cushion block includes silicon adhesive.

In an embodiment of the present invention, the package structure further includes at least an electronic device, which is disposed on the first surface of the circuit substrate and electrically connected to the contacts.

In an embodiment of the present invention, the above-mentioned electronic device includes an active device or a passive device.

In an embodiment of the present invention, the above-mentioned electronic device is electrically connected to the contacts on the first surface of the circuit substrate by using flip chip method.

In an embodiment of the present invention, the edge of the first surface of the above-mentioned circuit substrate further includes a protrusion for blocking a molding residue and thereby preventing the molding residue from contaminating the contacts on the circuit substrate.

In an embodiment of the present invention, the edge of the first surface of the above-mentioned circuit substrate further includes a cavity for accommodating a molding residue and thereby preventing the molding residue from contaminating the contacts on the circuit substrate.

In an embodiment of the present invention, the package structure further includes a first adhesive layer disposed between the inner lead portion of every lead and the second surface of the circuit substrate.

In an embodiment of the present invention, the package structure further includes a second adhesive layer disposed between the chip and the second surface of the circuit substrate.

The present invention further provides a package process, which includes following steps. First, a circuit substrate is provided, wherein the circuit substrate has a first surface and a second surface opposite to the first surface, and the circuit substrate has a plurality of contacts disposed on the first surface. Next, a leadframe is bonded onto the second surface of the circuit substrate, wherein the leadframe comprises a plurality of leads connected to each other, the leads are located on the periphery of the second surface of the circuit substrate, each of the leads has an inner lead portion and an outer lead portion, and each lead is electrically connected to the circuit substrate. Then, at least a chip is bonded onto the second surface of the circuit substrate, wherein the said leads surround the chip and the chip is electrically connected to the circuit substrate. After that, the circuit substrate, the chip and the leads are placed into a molding die, followed by injecting an encapsulant into the molding die so that the encapsulant encapsulates the circuit substrate, the chip and the inner lead portion of each lead, and the first surface of the circuit substrate and the outer lead portion of each lead are exposed, wherein the first surface of the circuit substrate contacts the molding die so as to make the formed upper surface of the encapsulant and the first surface of the circuit substrate are coplanar with each other. Further, the molding die is removed. Moreover, the said leads are separated to faun a package structure.

In an embodiment of the present invention, the above-mentioned package process further includes disposing a heat-sink on the inner lead portions of the leads prior to forming the encapsulant.

In an embodiment of the present invention, the inner lead portion provides a first carrying portion and a second carrying portion. The first carrying portion of the inner lead portion is disposed on the periphery of the second surface of the circuit substrate and the second carrying portion is connected between the first carrying portion and the outer lead portion.

In an embodiment of the present invention, the above-mentioned first carrying portion of the inner lead portion has a height difference from the second carrying portion.

In an embodiment of the present invention, the inner lead portion is electrically connected to the circuit substrate via at least a first bonding wire, or is electrically connected to the chip via at least a third bonding wire.

In an embodiment of the present invention, the material of the first bonding wire and the third bonding wire includes gold, silver, copper, aluminium or an alloy thereof.

In an embodiment of the present invention, the chip is electrically connected to the circuit substrate via at least a second bonding wire.

In an embodiment of the present invention, the material of the second bonding wire includes gold, silver, copper, aluminium or an alloy thereof.

In an embodiment of the present invention, the said package process further includes respectively disposing a cushion block at the bonding place between the circuit substrate and each inner lead portion prior to bonding the leadframe onto the circuit substrate.

In an embodiment of the present invention, the said package process further includes disposing at least an electronic device on the first surface of the circuit substrate after separating the leads, and electrically connecting the electronic device to the contacts.

In an embodiment of the present invention, the electronic device includes an active device or a passive device.

In an embodiment of the present invention, the above-mentioned electronic device is electrically connected to the contacts on the first surface of the circuit substrate by using flip chip method.

In an embodiment of the present invention, the said package process further includes forming a protrusion at the edge of the first surface of the circuit substrate prior to forming the encapsulant for blocking a molding residue and thereby preventing the molding residue from contaminating the contacts on the circuit substrate.

In an embodiment of the present invention, the said package process further includes forming a cavity at the edge of the first surface of the circuit substrate prior to forming the encapsulant for accommodating a molding residue and thereby preventing the molding residue from contaminating the contacts on the circuit substrate.

In an embodiment of the present invention, the said package process further includes forming a first adhesive layer at the bonding places between the circuit substrate and all the inner lead portions prior to bonding the leadframe onto the circuit substrate.

In an embodiment of the present invention, the said package process further includes curing the above-mentioned first adhesive layer after bonding the leadframe onto the circuit substrate.

In an embodiment of the present invention, the said package process further includes forming the above-mentioned outer lead portions after forming the encapsulant.

Based on the description above, the package structure provided by the present invention adopts a carrier architecture integrating both a leadframe and a circuit substrate therein, wherein the leads of the leadframe serve as the output leads of the package structure and the circuit substrate has a plurality of contacts exposed out of the package structure so as to bond other electronic devices (for example, memory chip) thereto. Besides, the upper surface of the encapsulant and the first surface of the circuit substrate are coplanar with each other, which is helpful to avoid melt-flashing problem during molding and increase the bonding effect for the devices of the successive processes. In addition, the package structure of the present invention has good compatibility and good system-integrating capability.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
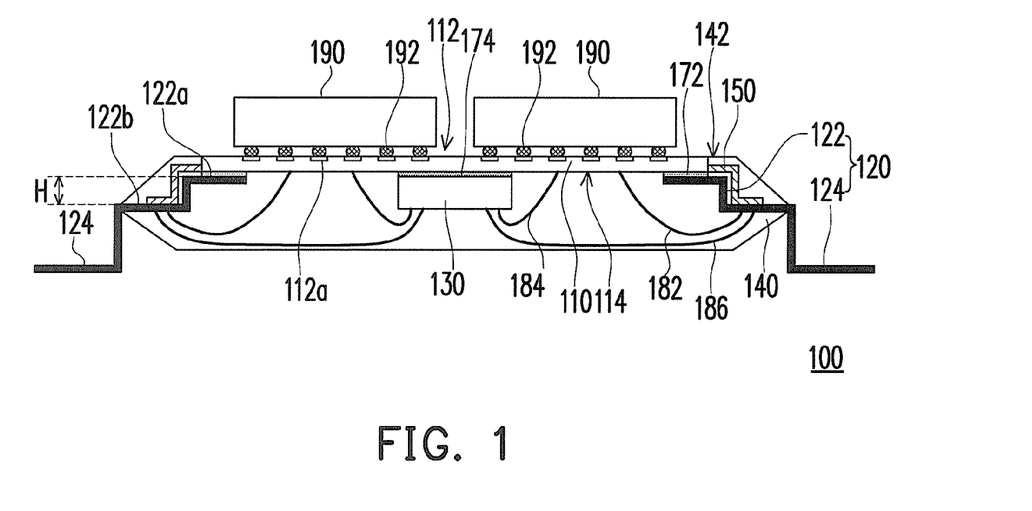
FIG. 1 is a diagram of a package structure according to an embodiment of the present invention.
Figure 2:
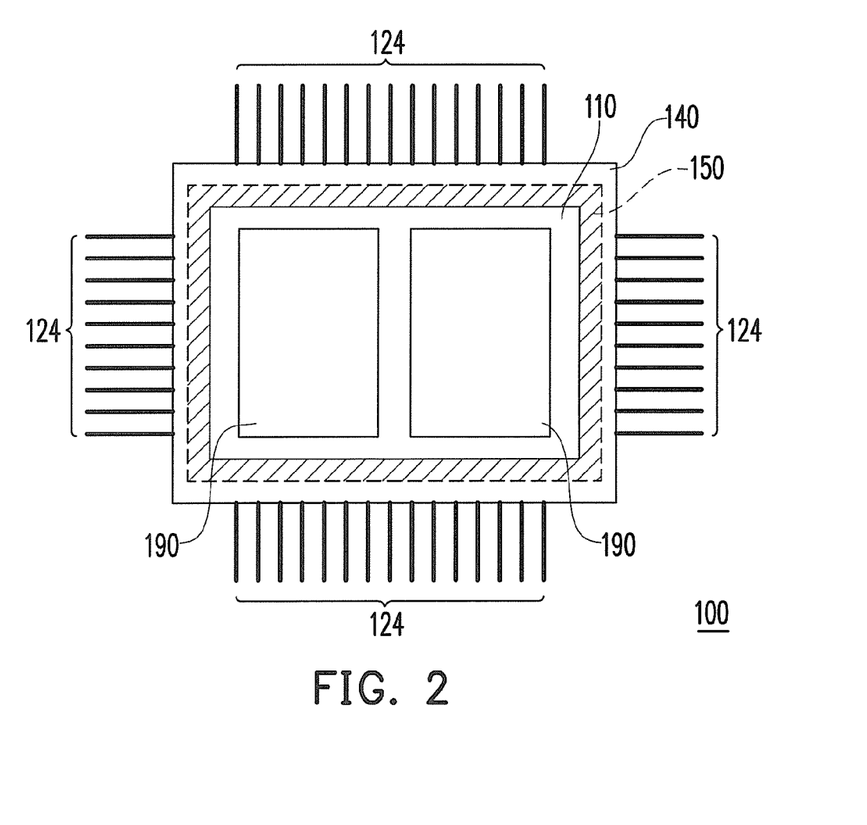
FIG. 2 is a top-view diagram of the package structure of FIG. 1.

FIG. 1 is a diagram of a package structure according to an embodiment of the present invention and FIG. 2 is a top-view diagram of the package structure of FIG. 1. Referring to FIGS. 1 and 2, a package structure 100 includes a circuit substrate 110, wherein the circuit substrate 110 has a first surface 112 and a second surface 114 opposite to each other. The circuit substrate 110 is an appropriate substrate, for example, BT palletizing substrate, FR-4 substrate, FR-5 substrate, ceramic substrate or polyimide substrate.

A plurality of leads 120 are disposed on the periphery of the second surface 114 of the circuit substrate 110, and each of the leads 120 includes an inner lead portion 122 located inside the package structure 100 and an outer lead portion 124 located outside the package structure 100. The inner lead portion 122 is bonded with the second surface 114 of the circuit substrate 110 via a first adhesive layer 172 and is electrically connected to the circuit substrate 110 via at least a first bonding wire 182 with wiring bonding method. The material of the first bonding wire 182 includes gold, silver, copper, aluminium or an alloy thereof.

The leads 120 in the embodiment come from the leadframe. The design is similar to the conventional leadframe, but the present embodiment directly uses a plurality of leads in the leadframe without using the chip pads. In addition, the leads 120 of the embodiment are arranged along the four edges of the circuit substrate 110 so as to form a lead disposing layout suiting a QFP structure. In other embodiments of the present invention however, the present invention is not limited to the above-mentioned QFP structure and the disposing manner and the quantity of the leads can be adjusted depending on the real requirement, which is omitted to describe.

In the embodiment, the inner lead portion 122 can be optionally formed into a first carrying portion 122a and a second carrying portion 122b, wherein the first carrying portion 122a is disposed on the periphery of the second surface 114 of the circuit substrate 110, the second carrying portion 122b is connected between the first carrying portion 122a and the outer lead portion 124, and there is a height difference H between the first carrying portion 122a and the second carrying portion 122b for increasing the elevation of the circuit substrate 110 in the package structure 100.

Continuing to FIGS. 1 and 2, the chip 130 is disposed on the second surface 114 of the circuit substrate 110 through a second adhesive layer 174. In the embodiment, the chip 130 is bonded to the circuit substrate 110 by using wiring bonding method, i.e., the chip 130 is electrically connected to the circuit substrate 110 via at least a second bonding wire 184. The material of the second bonding wire 184 includes gold, silver, copper, aluminium or an alloy thereof. Besides, the chip 130 can be electrically connected to the inner lead portion 122 as well via at least a third bonding wire 186. The material of the third bonding wire 182 includes gold, silver, copper, aluminium or an alloy thereof.

In the embodiment, a single wiring bonding process is conducted to make the inner lead portion 122 of each lead 120 and the chip 130 electrically connected to the circuit substrate 110. In other words, the first bonding wire 182 electrically connected between the leads 120, the second bonding wire 184 electrically connected the circuit substrate 110 and the chip 130 and the third bonding wire 186 electrically connected between the chip 130 and the inner lead portion 122 are simultaneously formed. In other embodiments of the present invention however, other methods, for example, flip chip technology, can be used to electrically connect the chip to the circuit substrate, which is omitted to describe.

The encapsulant 140 encapsulates the circuit substrate 110, the chip 130 and the inner lead portion 122 of each lead 120, and the first surface 112 of the circuit substrate 110 and the outer lead portion 124 of each lead 120 are exposed. The first surface 112 of the circuit substrate 110 has a plurality of contacts 112a disposed thereon, wherein the contacts 112a are exposed out of the encapsulant 140 to bond with the external electronic device 190.

It should be noted that in the embodiment, the upper surface 142 of the encapsulant 140 and the first surface 112 of the circuit substrate 110 are coplanar with each other. The first surface 112 of the circuit substrate 110 contacts the molding die during molding so as to ensure the horizontal of the circuit substrate 110 is controlled within an allowable range, which is helpful to avoid the possible melt-flashing during molding. In the above-mentioned way, the contacts 112a can be preserved so as to facilitate disposing the electronic device 190 on the first surface 112 of the circuit substrate 110 and achieve effective electrical connection between the electronic device 190 and the contacts 112a.

The above-mentioned electronic device 190 can be, for example, one or more memory chips, or other appropriate active devices or passive devices. The electronic device 190 is bounded to the contacts 112a on the first surface 112 of the circuit substrate 110 via a plurality of solder balls 192 by using flip chip technology. The outer lead portion 124 is downwards bended into an appropriate shape so as to electrically connect a printed circuit board (PCB) or other external circuits.

In the embodiment, the design of bonding the circuit substrate 110 to the external electronic device 190 is advantageous in providing the circuit substrate 110 with a number of contacts and variable layouts of contacts. Thus, the embodiment can be broadly used in various electronic devices with different layouts of in/out contacts. In comparison with the conventional leadframe, the embodiment is able to adjust the outward contacts 112a of the circuit substrate 110 according to the specification of the applicable electronic device. As a result, the package structure of the embodiment has good compatibility and good system-integrating capability.

Continuing to FIGS. 1 and 2, in addition to the above-mentioned employed parts, in the embodiment, a heatsink 150 can be disposed inside the encapsulant 140 so as to promote the heat dissipation capability of the encapsulant 140. In FIG. 2, a dot-line pattern is to represent the heatsink 150 indicating the shape and position thereof. The adopted heatsink 150 herein is, for example, a frame shape, which surrounds the circuit substrate 110 and contacts the inner lead portions 122 of the leads 120. In general, the material of the heatsink 150 can be metal or other materials with good conductivity. By means of the heatsink 150, the package structure 100 of the embodiment has good heat dissipation capability so as to keep the chip 130 for normal running.

Figure 3:
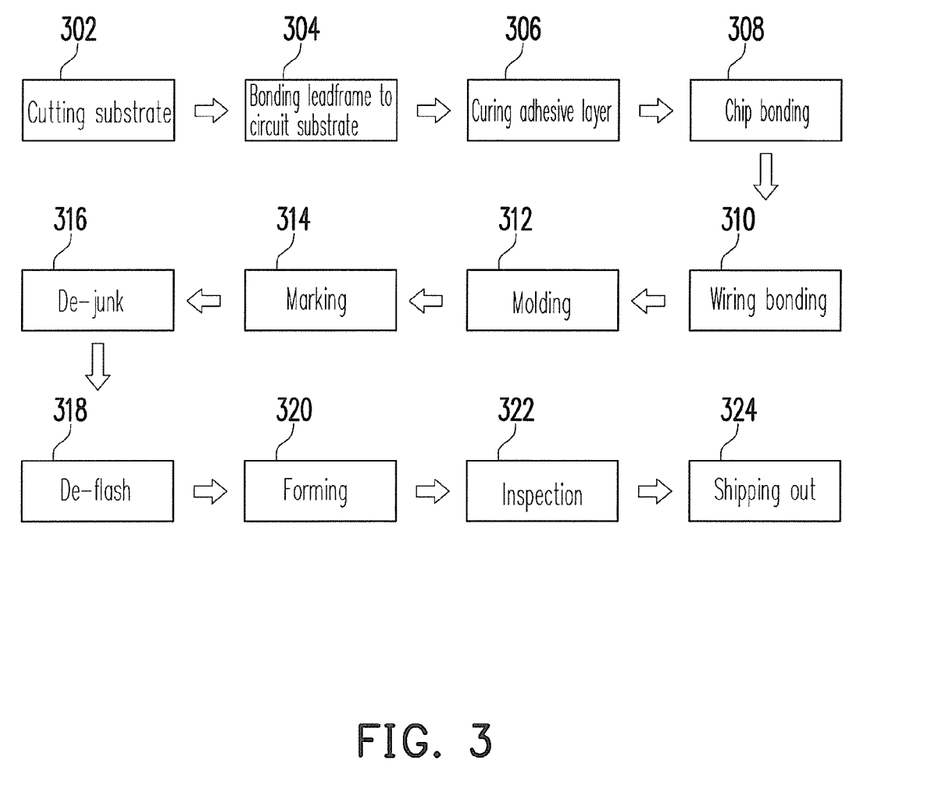
FIG. 3 is a flowchart for fabricating a package structure according to an embodiment of the present invention.

FIG. 3 is a flowchart for fabricating a package structure 100 according to an embodiment of the present invention. Referring to FIGS. 1-3, first in step 302, a big-size mother substrate is trimmed into a plurality of circuit substrates 110. Next in step 304, the leadframe is bonded to the circuit substrate 110, wherein the leadframe, as description above, includes a plurality of leads 120 connected to each other. The leads 120 are bonded with the second surface 114 of the circuit substrate 110 through a first adhesive layer 172. Then in step 306, the first adhesive layer 172 is cured.

After that in step 308, the chip 130 is bonded to the second surface 114 of the circuit substrate 110, and the leads 120 surround the chip 130. Further in step 310, a wiring bonding process is conducted to form first bonding wires 182, second bonding wires 184 and third bonding wires 186, wherein the first bonding wires 182 are used to electrically connect the inner lead portions 122 of the leads 120 to the circuit substrate 110, the second bonding wires 184 are used to electrically connect the chip 130 to the circuit substrate 110 and the third bonding wires 186 are used to electrically connect the chip 130 to the inner lead portions 122.

Figure 4:
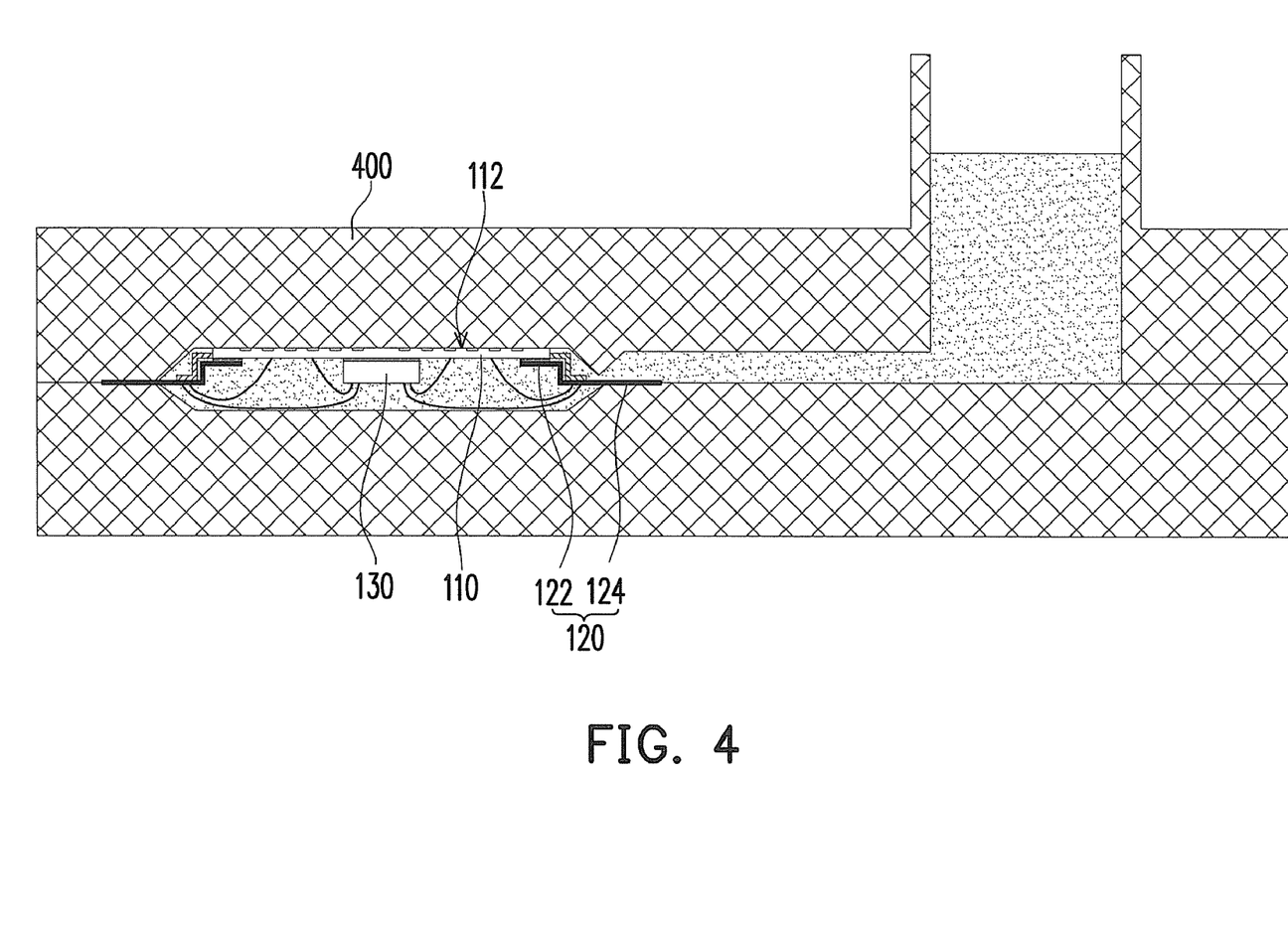
FIG. 4 is a diagram showing a molding step according to an embodiment of the present invention.

Further in step 312, a molding process is conducted. FIG. 4 is a diagram showing a molding step according to an embodiment of the present invention. Referring to FIG. 4, the circuit substrate 110, the chip 130 and the leads 120 are placed in a molding die 400, followed by injecting the encapsulant 140 into the molding die 400. In this way, the encapsulant 140 encapsulates the circuit substrate 110, the chip 130 and the inner lead portion 122 of each lead 120, and the first surface 112 of the circuit substrate 110 and the outer lead portion 124 of each leads 120 are exposed. In step 312, in order to make the upper surface 142 of the encapsulant 140 and the first surface 112 of the circuit substrate 110 coplanar with each other, the first surface 112 of the circuit substrate 110 contacts the molding die 400 during injecting the encapsulant, so that the horizontal of the circuit substrate 110 is controlled within an allowable range and possible melt-flashing can be avoided.

Further in step 314, a marking process is conducted so as to form a specific pattern on the encapsulant 140. Further in step 316, a de junk process is conducted, that is to say, a cutter is used to cut out redundant encapsulant and the leads 120 originally bonded to each other are separated from each other. Further in step 318, a de-flash process is conducted for removing the residue encapsulant on the package structure 100. Further in step 320, the outer lead portions 124 of the leads 120 are formed. Further in step 322, a process of final visual inspection (FVI) is conducted prior to shipping out. Finally in step 324, the package structure 100 goes to the warehouse for shipping out.

As the description in FIGS. 1 and 2, if a heatsink 150 is embedded inside the encapsulant 140, the frame-shaped heatsink 150 can be optionally disposed on the inner lead portions 122 of the leads 120 prior to step 312 (molding) so as to make the heatsink 150 surround the chip 130. In this way, after step 312, the encapsulant 140 encapsulates the heatsink 150.

The process of FIG. 3 is an example of the present invention, wherein some of the steps are the steps used in the package process nowadays. Anyone skilled in the art can adjust, omit or add some steps appropriately according to the application practice to meet the process requirement, which is omitted to describe.

Figure 5:
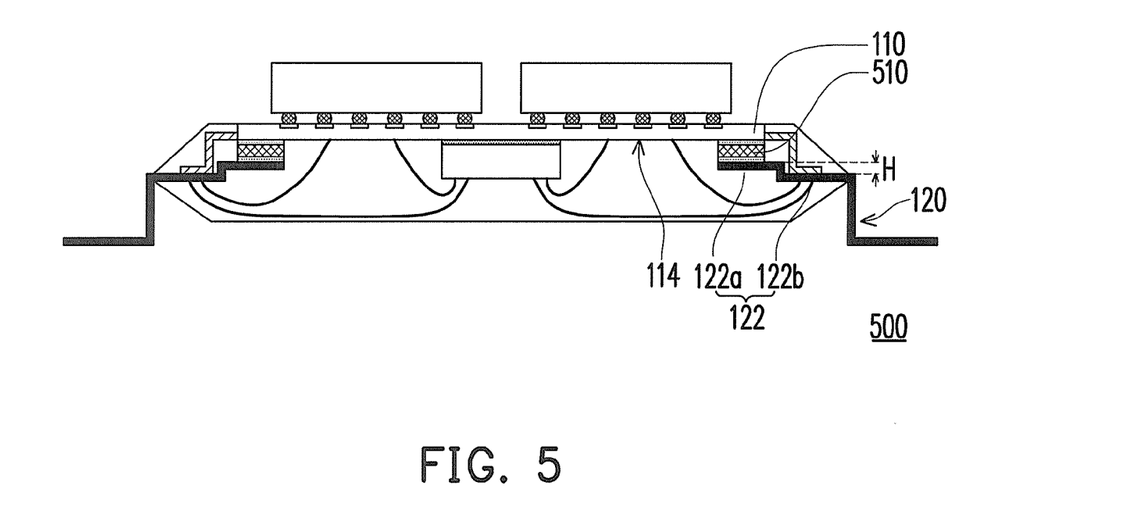
FIG. 5 is a diagram of a package structure according to another embodiment of the present invention.
Figure 6:
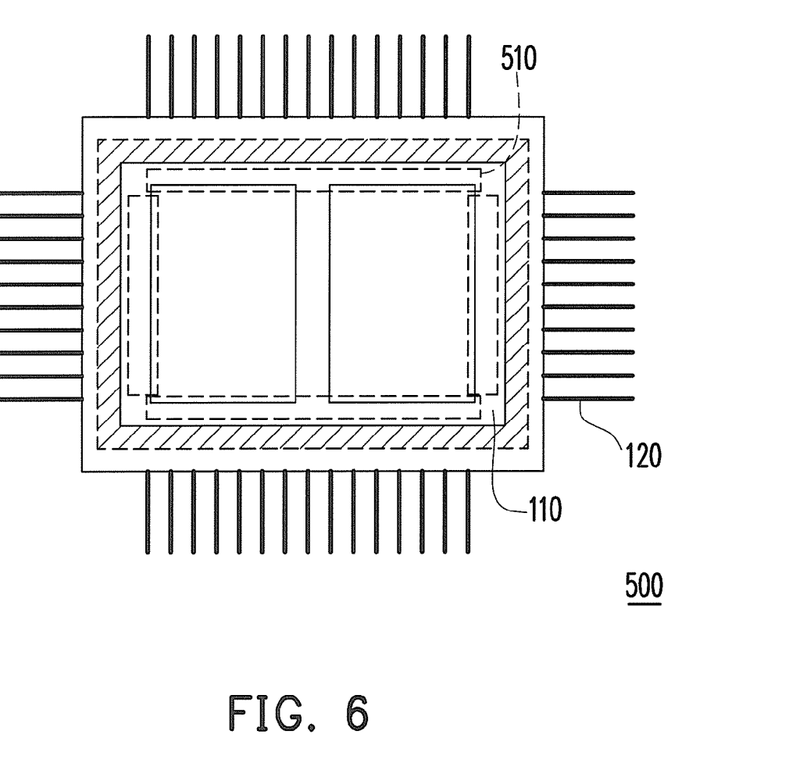
FIG. 6 is a top-view diagram of the package structure of FIG. 5.

FIG. 5 is a diagram of a package structure according to another embodiment of the present invention and FIG. 6 is a top-view diagram of the package structure of FIG. 5. The present embodiment uses the notations of the parts and the partial content of the above-mentioned embodiment, wherein the same reference numbers are used to indicate the same or the similar components, and the same technical contents as the above-mentioned embodiment are omitted for simplicity and can refer to the hereinbefore context.

Referring to FIGS. 5 and 6, the package structure 500 of the embodiment has a major difference from the above-mentioned embodiment in that a cushion block 510 is disposed between the inner lead portions 122 of the leads 120 and the second surface 114 of the circuit substrate 110. In FIG. 6, a dot-line pattern is to represent the cushion block 510 indicating the shape and position thereof. In more details, the ductibility and the strength of the material itself of the leads 120 affect the stamping depth during the forming, and the stamping depth is just the height difference H between the first carrying portion 122a and the second carrying portion 122b of the inner lead portion 122. Considering the thickness of the encapsulant 140 has a minimum limitation, the height difference H becomes the key to decide whether or not the encapsulant 140 can expose the first surface 112 of the circuit substrate 110. Obviously, the thickness of the circuit substrate 110 or the encapsulant 140 is also one of factors to be considered. Based on the description above, if the ductibility or the strength of the material itself of the leads 120 is not enough, the height difference H with a wished thickness can not be produced during forming. To solve the potential problem, as the description of the embodiment, a cushion block 510 is disposed at the bonding places between the leads 120 and the circuit substrate 110, i.e., between the first carrying portions 122a of the inner lead portions 122 and the second surface 114, so that a sufficient relative height difference between the circuit substrate 110 and the inner lead portions 122 is realized to thereby facilitate accomplishing the package process.

The package structure 500 of the embodiment can be fabricated by using the process mainly similar to that for the package structure 100 of the above-mentioned embodiment except that in step 304, i.e., prior to bonding the leadframe to the circuit substrate 110, the cushion block 510 is disposed at the bonding places between the circuit substrate 110 and the first carrying portions 122a of the inner lead portions 122. After that, steps 306-324 are sequentially conducted so as to accomplish the process of the package structure 500.

The design architecture of disposing the cushion block 510 provided by the embodiment expands the material selectivity of the leadframe and the dimension selectivity of other relevant components, such as the circuit substrate 110 or the encapsulant 140. In other words, the design of the package structure has more choices and the compatibility of the process is increased.

Figure 7:
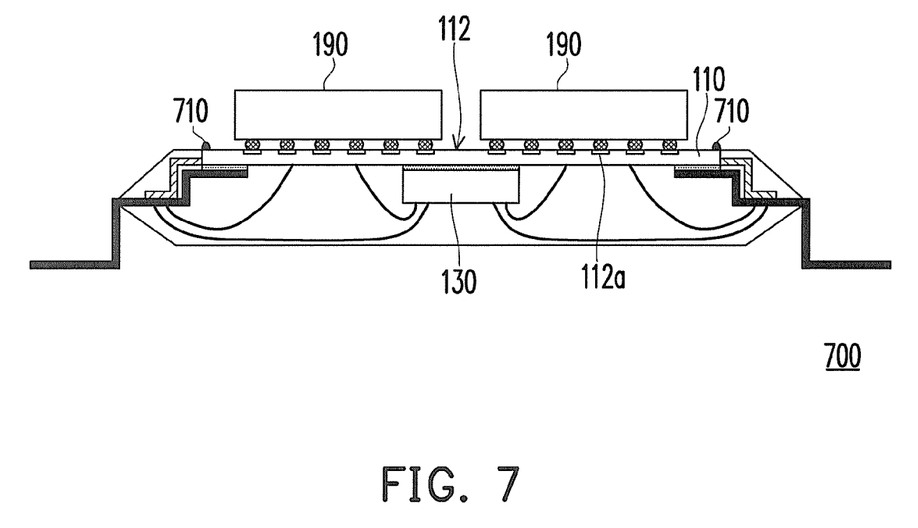
FIG. 7 is a diagram of a package structure according to yet another embodiment of the present invention.
Figure 8:
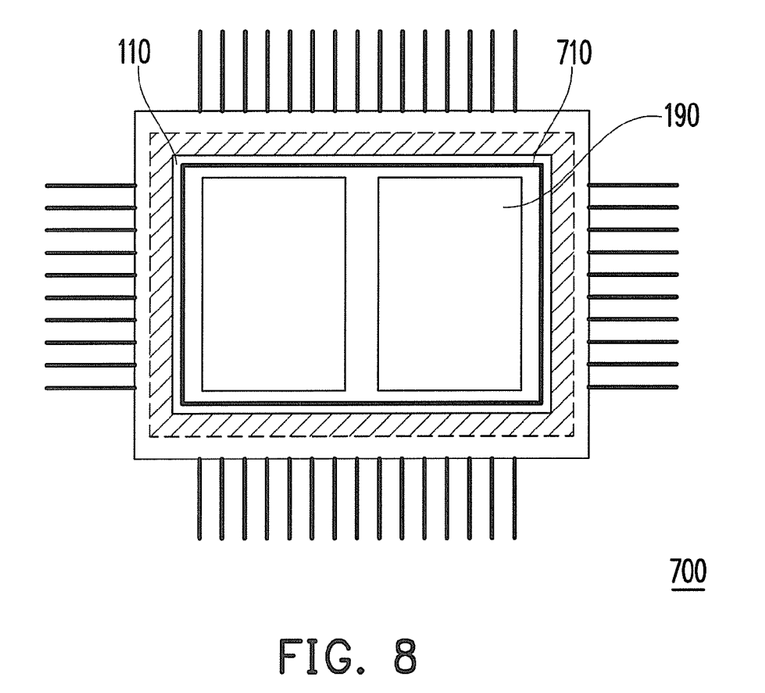
FIG. 8 is a top-view diagram of the package structure of FIG. 7.

FIG. 7 is a diagram of a package structure according to yet another embodiment of the present invention and FIG. 8 is a top-view diagram of the package structure of FIG. 7. The present embodiment uses the notations of the parts and the partial content of the above-mentioned embodiment, wherein the same reference numbers are used to indicate the same or the similar components, and the same technical contents as the above-mentioned embodiment are omitted for simplicity and can refer to the hereinbefore context.

Referring to FIGS. 7 and 8, the package structure 700 of the embodiment has a major difference from the above-mentioned embodiment that a protrusion 710 is formed at the edge of the first surface 112 of the circuit substrate 110, and the protrusion 710 surrounds the contacts 112a on the circuit substrate 110.

During forming the encapsulant 140, a melt-flashing phenomenon may occur due to an inclination of the die or other factors, which results in molding residue on the contacts 112a. With the melt-flashing, during bonding the electronic device 190 to the circuit substrate 110, there is no way to establish effective electrical connections between the electronic device 190 and the contacts 112a. To solve the problem, the embodiment employs the protrusion 710, wherein the protrusion 710 is able to prevent the molding residue from overflowing onto the contacts 112a of the first surface 112 to contaminate the contacts 112a during the molding, so that the contacts 112a are ensured to work effectively.

The package structure 700 of the embodiment can be fabricated by using the process mainly similar to that for the package structure 100 of the above-mentioned embodiment except that in step 312, i.e., prior to molding, the protrusion 710 is formed at the edge of the first carrying portions 122a of the inner lead portions 122. After that, steps 312-324 are sequentially conducted so as to accomplish the process of the package structure 700.

Figure 9A:
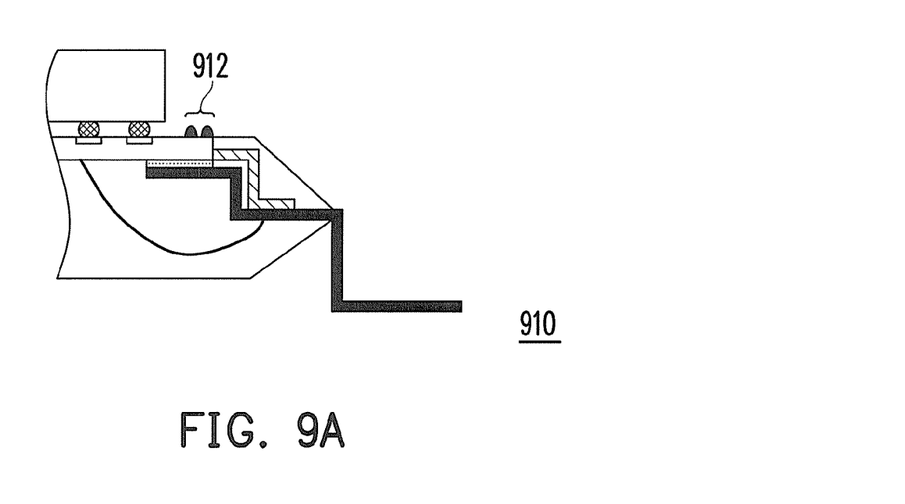
FIGS. 9A-9C are diagrams respectively showing a plurality of package structures according to different embodiments of the present invention.

It should be noted that the present invention does not limit the quantity and the shape of the protrusion. The package structure 910 shown by FIG. 9A has two protrusions 912 so as to ensure a better effect for preventing melt-flashing.

Figure 9B:
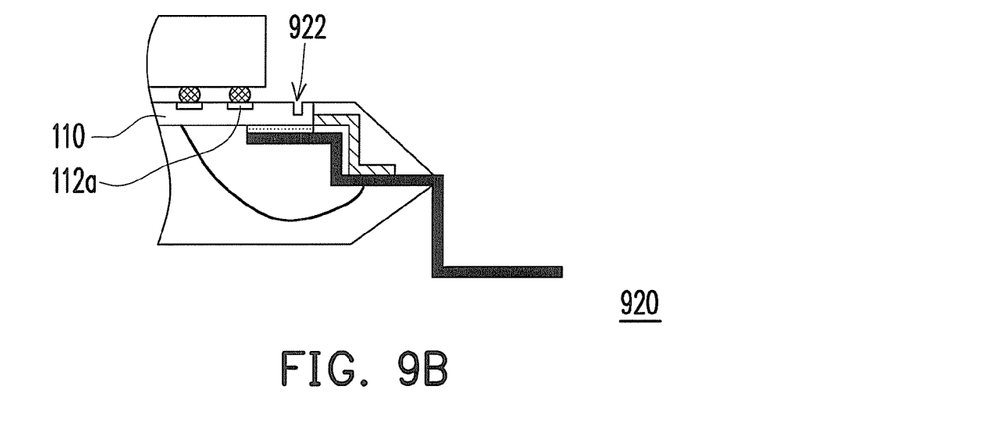
Figure 9C:
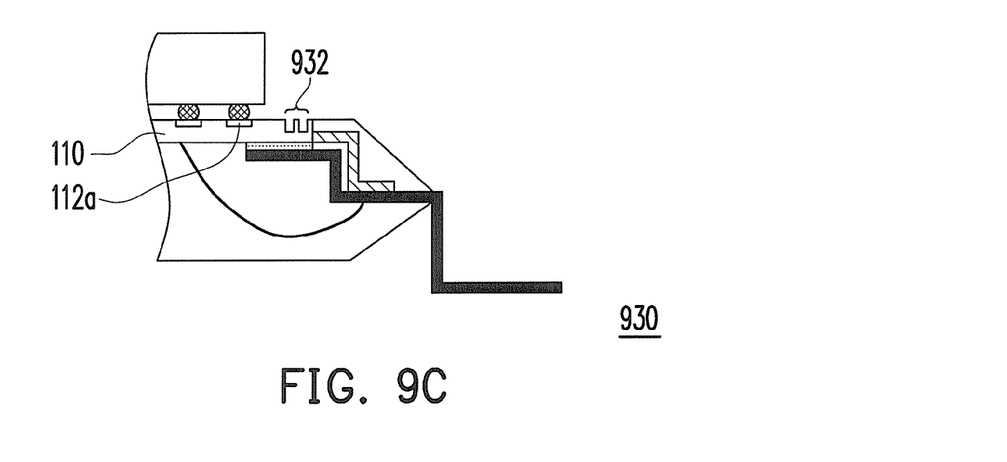

The present invention does not limit the shape of the structure for preventing melt-flashing. For example, the package structure 920 shown by FIG. 9B has a cavity 922, and the package structure 930 shown by FIG. 9C has two cavities 932. The cavities 922 and 932 can be respectively, for example, a trench, which is able to accommodate the molding residue to prevent the molding residue from contaminating the contacts 112a on the circuit substrate 110.

All the above-mentioned parts including the heatsink 150 for enhancing cushion block 510 for promoting the process compatibility and the protrusions 710 and 912 and the cavities 922 and 932 for preventing melt-flashing can be selectively used in the package structures of the present invention. Anyone skilled in the art can refer the descriptions of the above-mentioned embodiments and select one or a plurality of the above-mentioned parts in the designs themselves to meet the real requirement and to achieve the required technical effect.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A package structure, comprising:
a circuit substrate, having a first surface, a second surface opposite to the first surface, a plurality of side surfaces connected between the first surface and the second surface, and a plurality of contacts disposed on the first surface;
at least a chip, disposed on the second surface of the circuit substrate and electrically connected to the circuit substrate;
a plurality of leads, disposed on the periphery of the second surface of the circuit substrate to surround the chip, wherein each of the leads has an inner lead portion and an outer lead portion, and each lead is electrically connected to the circuit substrate via the inner lead portion thereof;
an encapsulant, encapsulating the circuit substrate, the chip and the inner lead portion of each lead and exposing the first surface of the circuit substrate and the outer lead portion of each lead, wherein an upper surface of the encapsulant and the first surface of the circuit substrate are coplanar with each other; and
a heatsink, embedded inside the encapsulant and contacting the inner lead portions of the leads, wherein the heatsink has a frame shape and surrounds the circuit substrate, an end of the heatsink is attached to the inner lead portion of each of the plurality of leads, and another end of the heatsink is leant against the side surfaces of the circuit substrate.

2. The package structure as claimed in claim 1, wherein the inner lead portion has a first flat portion and a second flat portion, the first flat portion of the inner lead portion is disposed on the periphery of the second surface of the circuit substrate, and the second flat portion is connected between the first flat portion and the outer lead portion.

3. The package structure as claimed in claim 2, wherein the first flat portion of the inner lead portion has a height difference from the second flat portion.

4. The package structure as claimed in claim 1, further comprising at least a first bonding wire and at least a second bonding wire, wherein the first bonding wire is electrically connected between the corresponding inner lead portion and the circuit substrate, and the second bonding wire is electrically connected between the chip and the circuit substrate.

5. The package structure as claimed in claim 1, further comprising at least a third bonding wire electrically connected between the chip and the inner lead portion.

6. The package structure as claimed in claim 1, further comprising a cushion block, disposed at the periphery of the second surface of the circuit substrate and clamped between the inner lead portion of every lead and the second surface of the circuit substrate.

7. The package structure as claimed in claim 6, wherein the material of the cushion block comprises silicon adhesive.

8. The package structure as claimed in claim 1, further comprising at least an electronic device, disposed on the first surface of the circuit substrate and electrically connected to the contacts.

9. A package structure, comprising:
a circuit substrate, having a first surface, a second surface opposite to the first surface, and a plurality of side surfaces connected between the first surface and the second surface;
a chip, disposed on the circuit substrate and electrically connected to the circuit substrate;
a plurality of leads, disposed on the periphery of the circuit substrate, wherein each of the leads has an inner lead portion and an outer lead portion, and each inner lead portion is electrically connected to the circuit substrate;
an encapsulant, encapsulating the circuit substrate, the chip and the inner lead portion of each lead and exposing the first surface of the circuit substrate and the outer lead portion of each lead; and
a heatsink, embedded inside the encapsulant and contacting the inner lead portions of the leads, wherein the heatsink has a frame shape and surrounds the circuit substrate, an end of the heatsink is attached to the inner lead portion of each of the plurality of leads, and another end of the heatsink is leant against the side surfaces of the circuit substrate.

10. The package structure as claimed in claim 9, wherein the inner lead portion has a first flat portion disposed on the periphery of the circuit substrate, a second flat portion connected with the outer lead portion, and a step formed between the first flat portion and the second flat portion.

11. The package structure as claimed in claim 9, further comprising a cushion block, disposed at the periphery of the circuit substrate and clamped between the inner lead portion of every lead and the circuit substrate.

12. The package structure as claimed in claim 9, further comprising at least an electronic device, disposed on the first surface of the circuit substrate and electrically connected to the circuit substrate by a flip chip technology.

13. A package structure, comprising:
- a circuit substrate, having a first surface, a second surface opposite to the first surface, a plurality of side surfaces connected between the first surface and the second surface, and a plurality of contacts disposed on the first surface;
- an electronic device, disposed on the first surface of the circuit substrate and electrically connected to the contacts by a flip chip technology;
- a chip, disposed on the second surface of the circuit substrate and electrically connected to the circuit substrate via a plurality of bonding wires;
- a plurality of leads having an inner lead portion and an outer lead portion, wherein the inner lead portions are disposed on the periphery of the second surface of the circuit substrate and electrically connected to the circuit substrate;
- an encapsulant, encapsulating the circuit substrate, the chip and the inner lead portion of each lead and exposing the outer lead portion of each lead; and
- a heatsink, embedded inside the encapsulant, wherein the heatsink has a frame shape and surrounds the circuit substrate, and an end of the heatsink is attached to the inner lead portion of each of the plurality of leads, and another end of the heatsink is leant against the side surfaces of the circuit substrate.

14. The package structure as claimed in claim 13, wherein the inner lead portion has a first flat portion disposed on the periphery of the second surface of the circuit substrate, a second flat portion connected with the outer lead portion, and a step formed between the first flat portion and the second flat portion.

15. The package structure as claimed in claim 13, further comprising a plurality of cushion blocks, respectively disposed between the inner lead portion of each of the plurality of leads and the second surface of the circuit substrate.

* * * * *